United States Patent
Kim et al.

(10) Patent No.: US 10,416,193 B2
(45) Date of Patent: Sep. 17, 2019

(54) CIRCUIT, DEVICE, AND METHOD TO MEASURE BIOSIGNAL USING COMMON MODE DRIVEN SHIELD

(71) Applicants: Samsung Electronics Co., Ltd., Suwon-si (KR); SNU R&DB Foundation, Seoul (KR)

(72) Inventors: Youn Ho Kim, Hwaseong-si (KR); Jae Min Kang, Seoul (KR); Kun Soo Shin, Seongnam-si (KR); Kwang Suk Park, Seoul (KR); Jeong Su Lee, Seoul (KR); Yong Gyu Lim, Seoul (KR)

(73) Assignees: Samsung Electronics Co., Ltd., Suwon-si (KR); SNU R&DB Foundation, Seoul (KR)

( * ) Notice: Subject to any disclaimer, the term of this patent is extended or adjusted under 35 U.S.C. 154(b) by 1040 days.

(21) Appl. No.: 14/454,486

(22) Filed: Aug. 7, 2014

(65) Prior Publication Data

US 2015/0042313 A1 Feb. 12, 2015

(30) Foreign Application Priority Data

Aug. 8, 2013 (KR) .......................... 10-2013-0094166

(51) Int. Cl.
  *G01R 1/067* (2006.01)
  *H03H 11/12* (2006.01)
  *G01R 1/18* (2006.01)
(52) U.S. Cl.
  CPC ....... *G01R 1/06794* (2013.01); *H03H 11/126* (2013.01); *G01R 1/18* (2013.01); *H03H 2240/00* (2013.01)

(58) Field of Classification Search
  CPC ............ G01R 33/0283; G01R 33/3628; G01R 15/185; G01R 31/25
  USPC ............ 324/128, 76.11, 76.44, 76.29, 76.31, 324/76.68, 76.75, 686, 600, 609, 324/515–530, 200, 239
  See application file for complete search history.

(56) References Cited

U.S. PATENT DOCUMENTS 5,392,784 A 2/1995 Gudaitis
6,496,721 B1 12/2002 Yonce
(Continued)

FOREIGN PATENT DOCUMENTS

KR 10-2005-0044266 A 5/2005
KR 10-2006-0050892 A 5/2006
(Continued)

OTHER PUBLICATIONS

Metting van Rijn, A.C., et al. "High-quality recording of bioelectric events. Part 2. Low-noise, low-power multichannel amplifier design." Medical & biological engineering & computing 29.4 (1991): 433-440.
(Continued)

*Primary Examiner* — Melissa J Koval
*Assistant Examiner* — Trung Nguyen
(74) *Attorney, Agent, or Firm* — NSIP Law

(57) ABSTRACT

An apparatus and method of removing common mode noise in the case of measuring a biosignal using a capacitive coupling active electrode (CCE) is provided. A frequency band of a common mode signal may interact with a shield voltage and thus, a frequency band of a biosignal may be compensated for.

26 Claims, 9 Drawing Sheets

(56) References Cited

U.S. PATENT DOCUMENTS

| | | | |
|---|---|---|---|
| 7,684,854 B2* | 3/2010 | Park | A61B 5/0428 600/382 |
| 2003/0052693 A1* | 3/2003 | Douglas | G01R 1/07 324/525 |
| 2009/0030298 A1* | 1/2009 | Matthews | A61B 5/6843 600/383 |
| 2012/0095361 A1* | 4/2012 | Xu | A61B 5/04004 600/547 |
| 2014/0371611 A1* | 12/2014 | Kim | A61B 5/0416 600/509 |

FOREIGN PATENT DOCUMENTS

| | | |
|---|---|---|
| KR | 10-2010-0005690 A | 1/2010 |
| KR | 10-1048567 B1 | 7/2011 |

OTHER PUBLICATIONS

Lim, Yong-Gyu, "A Study on Intrinsic Noise of Capacitively Coupled Active Electrode" Journal of the institute of signal processing and systems 13.1 (2012): 44-49.

* cited by examiner

CIRCUIT, DEVICE, AND METHOD TO MEASURE BIOSIGNAL USING COMMON MODE DRIVEN SHIELD

CROSS-REFERENCE TO RELATED APPLICATION(S)

This application claims the benefit under 35 U.S.C. § 119(a) of Korean Patent Application No. 10-2013-0094166, filed on Aug. 8, 2013, in the Korean Intellectual Property Office, the entire disclosure of which is incorporated herein by reference for all purposes.

BACKGROUND

1. Field

The following description relates to a biosignal measuring apparatus and a biosignal measuring method.

2. Description of Related Art

In cases where an object, such as clothes, for example, having a great electrical resistance is present between a human body and a ground of a measurement device, an indirect contact (IDC) biosignal measurement device may need to decrease common mode noise such as power noise, for example.

To decrease the common mode noise, the IDC biosignal measurement device may be designed to minimize impedance between the human body and the ground. To this end, electrical impedance between the human body and the ground may be minimized by increasing the electrical capacity between the human body and the ground by employing a maximally wide ground plate. Equivalent impedance between the human body and the ground may be decreased using a method called a right-leg-driven (RLD) ground method, an active ground method, or an active common method. In the case of using the RLD ground method, a size of the ground plate may be further reduced.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a capacitive coupling active electrode (CCE) circuit including an electrode face configured to sense a biosignal; a common mode interacting unit configured to enable a common mode signal to interact with a shield voltage in order to compensate for a frequency band; and a shield configured to provide the shield voltage.

The CCE circuit may further include a preamplifier configured to amplify the shield voltage and the biosignal, wherein the shield may be further configured to provide the shield voltage to the pre-amplifier.

The common mode interacting unit may include a filter configured to enable a signal of the frequency band in the common mode signal to pass.

The filter may include a capacitor, a resistance, and a passive element that are configured to enable the signal of the frequency band to pass at a gain.

The common mode interacting unit may include a frequency band changing unit configured to change a frequency band of the common mode signal for compensating for the biosignal according to a control of a user.

The common mode interacting unit may include a driven gain applying unit configured to enable the common mode signal to interact with the shield voltage by applying a common mode driven gain to the common mode signal at a ratio of input impedance to a sum of input impedance and shield impedance.

The common mode interacting unit may include an adjusting unit configured to adjust a gain and a phase of the common mode signal to correspond to a common mode driven gain.

The common mode interacting unit may include at least one of a low band pass (LBP) filter and a high band pass (HBP) filter through which the common mode signal passes.

In another general aspect, there is provided a device for measuring a biosignal, the device including a common mode interacting unit configured to feed back a common mode signal to a shield for compensating for a frequency band; a capacitive coupling active electrode (CCE) comprising an electrode face configured to measure the biosignal and the shield connected to the common mode interacting unit; and a differential amplifier configured to amplify a differential component of the biosignal measured by the CCE.

The device may further include a pre-amplifier disposed at a rear of the electrode face, wherein the shield may surround the electrode face and the pre-amplifier.

The common mode interacting unit may include a filter configured to enable a signal of the frequency band in the common mode signal to pass.

The filter may include a capacitor, a resistance, and a passive element that are configured to enable the signal of the frequency band to pass at a gain.

The common mode interacting unit may include a frequency band changing unit configured to change a frequency band of the common mode signal for compensating for the biosignal according to a control of a user.

The common mode interacting unit may include a driven gain applying unit configured to enable the common mode signal to interact with the shield voltage by applying a common mode driven gain to the common mode signal at a ratio of the input impedance to a sum of input impedance and shield impedance.

The common mode interacting unit may include an adjusting unit configured to adjust a gain and a phase of the common mode signal to correspond to a common mode driven gain.

The common mode interacting unit may include at least one of a low band pass (LBP) filter and a high band pass (HBP) filter through which the common mode signal passes.

In another general aspect, there is provided a method for measuring a biosignal, the method including sensing the biosignal; enabling a common mode signal to interact with a shield voltage in order to compensate for a frequency band; feeding back the shield voltage to the biosignal; and amplifying a differential component of the biosignal to which the shield voltage is fed back.

The enabling may include enabling a signal of the frequency band in the common mode signal to pass.

The enabling may include changing a frequency band of the common mode signal for compensating of the biosignal according to a control of a user.

The enabling may include enabling the common mode signal to interact with the shield voltage by applying a common mode driven gain to the common mode signal at a ratio of input impedance to a sum of input impedance and shield impedance.

The enabling may include adjusting a gain and a phase of the common mode signal to correspond to a common mode driven gain.

In another general aspect, there is provided an electrode circuit for sensing a biosignal, the electrode circuit including an interacting unit configured to enable a common mode signal to interact with a shield voltage in order to compensate for a frequency band; and a filter configured to enable a signal of the frequency band in the common mode signal to pass.

Figure 1:
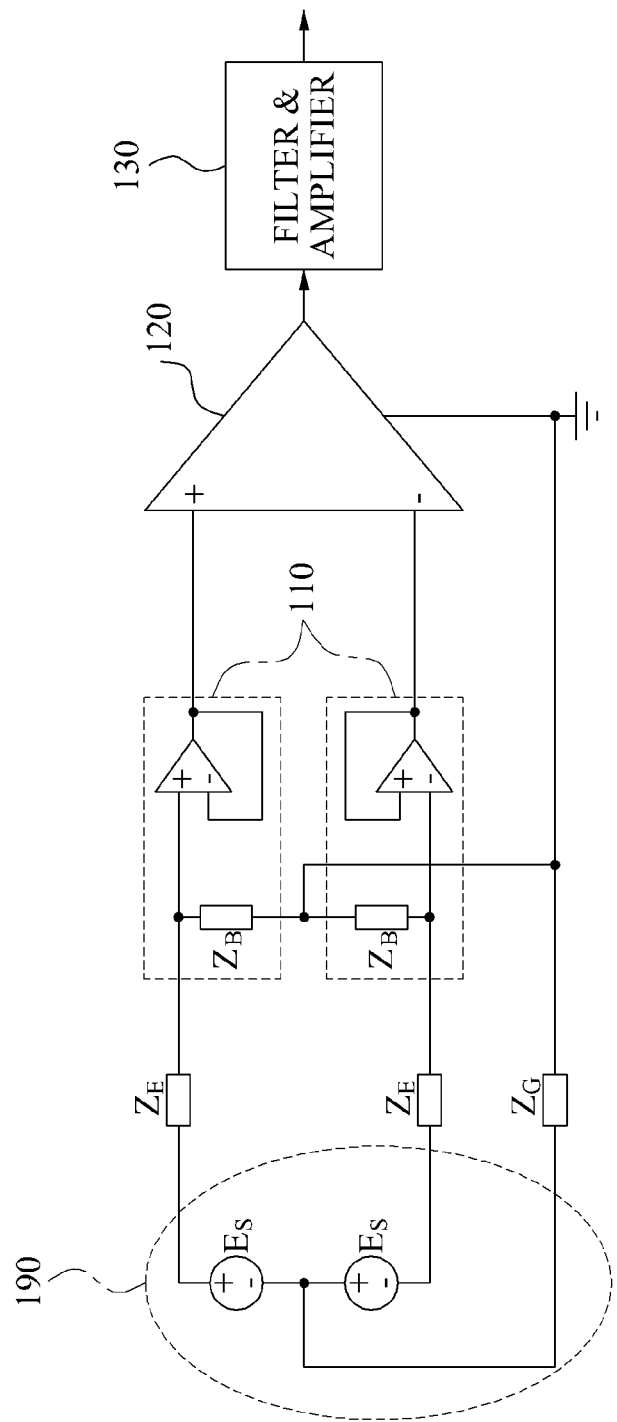
FIG. 1 is a circuit diagram illustrating an example of an electrical configuration of an indirect contact (IDC) biosignal measurement device.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described to herein have been provided so that this disclosure will be thorough and complete, and will convey the full scope of the disclosure to one of ordinary skill in the art.

FIG. 1 illustrates an example of an electrical configuration of an indirect contact (IDC) biosignal measurement device. The IDC biosignal measurement device may include an indirect contact electrocardiogram (IDC-ECG) measurement device. For example, IDC-ECG may refer to a measurement technology of measuring ECG on clothes without direct contact between the electrode and the human body 190. The IDC-ECG may include a capacitive coupling active electrode (CCE) 110 having a high input resistance, and a ground plate made of wide conductive fabric.

The CCE 110 may generate capacitive coupling between the skin and the electrode by indirectly contacting the skin of the human body 190 through clothes. A differential component may be extracted from each of two signals measured from two active electrodes using a differential amplifier 120. In this example, an ECG waveform is obtained by amplifying and filtering the differential component using an amplifier and a filter 130. A ground plate may ground the human body 190 based on capacitive coupling through clothes, without directly contacting the skin of the human body 190. For example, even though the human body 190 and measurement equipment do not directly contact each other, a biosignal may be measured using the CCE 110 and an IDC ground plate.

Figure 2:
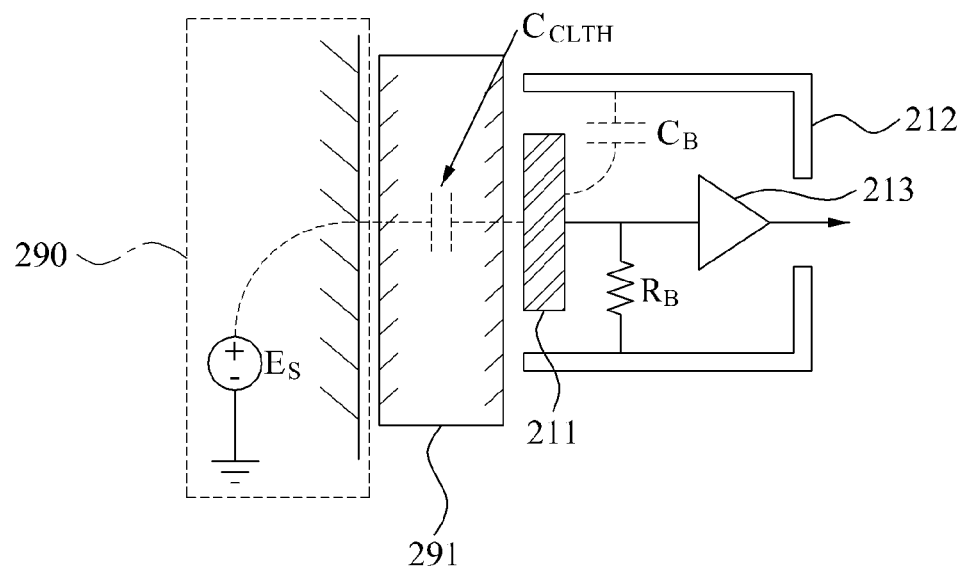
FIG. 2 is a circuit diagram illustrating an example of a capacitive coupling active electrode (CCE).

FIG. 2 illustrates an example of a CCE. Referring to FIG. 2, the CCE may include an electrode face 211 provided as a metal plate, a pre-amplifier 213 disposed at the rear of the electrode face 211, and a metal shield 212 configured to surround the electrode face 211 and a rear surface of the electrode face 211. In a case in which clothes 291 are present between the electrode face 211 and the human body 290, capacitive coupling such as $C_{CLTH}$ may be generated.

In various aspects, resistance $R_B$ may be connected between a ground and an input terminal of the pre-amplifier 213 in order to stabilize an amplifier by flowing bias current in an amplifier element, for example, a transistor or an operation amplifier included in the pre-amplifier 213. In an example of measuring a biosignal using an indirect contact, high resistance, a resistance of 2G Ω or more may be used to increase input impedance of the amplifier. Here, stray capacitance $C_B$ may be present between the electrode face 211 and the ground.

Figure 3:
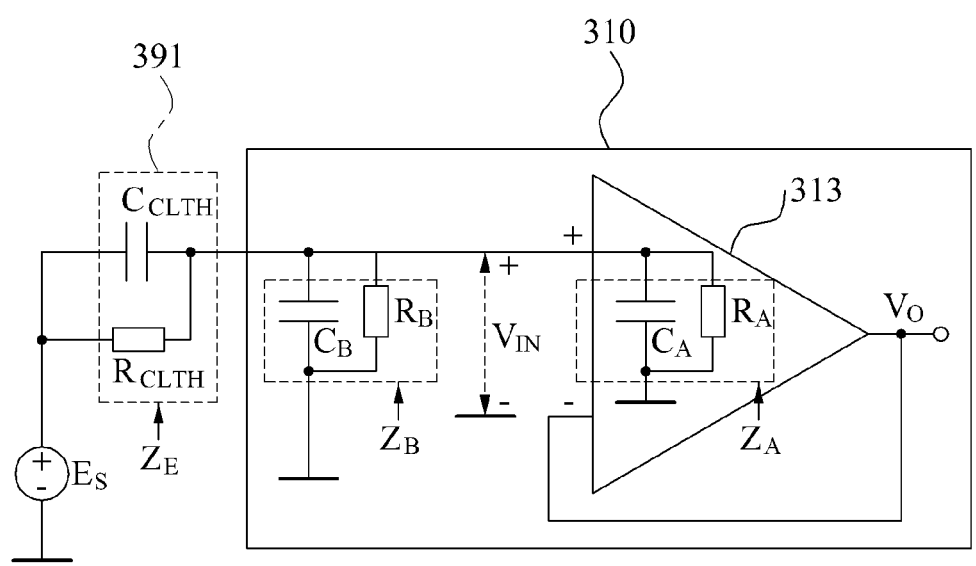
FIG. 3 is a circuit diagram illustrating an example of an electrical model of a CCE.

FIG. 3 illustrates an example of an electrical model of a CCE 310. Referring to FIG. 3, $E_S$ denotes a signal source, that is, a biosignal generator in the case of measuring a biosignal, and $Z_E$ denotes impedance of clothes 391 present between the electrode and the skin of a human body. Input impedance $Z_A$ of a pre-amplifier 313 may be modeled as a capacitor $C_A$ and a resistance $R_A$. The impedance $Z_E$ of the clothes 391 may be modeled as a capacitor $C_{CLTH}$ and a resistance $R_{CLTH}$. Input voltage of the pre-amplifier 313 may be expressed as $V_{IN}$ and output voltage of the pre-amplifier 313 may be expressed as $V_O$.

To remove common mode noise in the CCE 310, a differential measurement method using two electrode signals may be employed to measure a biosignal using an indirect contact method together with a general biosignal measurement method. In this example, even though the differential measurement method is used, the common mode noise may not be completely removed. For example, a common mode rejection ratio (CMRR) of the pre-amplifier 313 may be limited. A portion of common mode voltage may be switched to a differential mode voltage due to a difference in impedance between two electrodes. Thus, the common mode noise may not be completely removed. Here, due to a characteristic of indirect contact through the clothes 391, power noise by the impedance difference of the clothes 391 between two electrodes may be great in the case of measuring a biosignal using the indirect contact method.

For example, in an IDC biosignal measurement system, a shield may be connected to a ground of an IDC biosignal measurement device and the resistance $R_B$ connected to the shield may also be connected to the ground. Such shielding method will be referred to as a grounded shield.

To decrease common mode noise, a common mode driven shield may vary a shield voltage during interaction with a common mode input voltage. An operation of the common mode driven shield will be described below.

Figure 4:
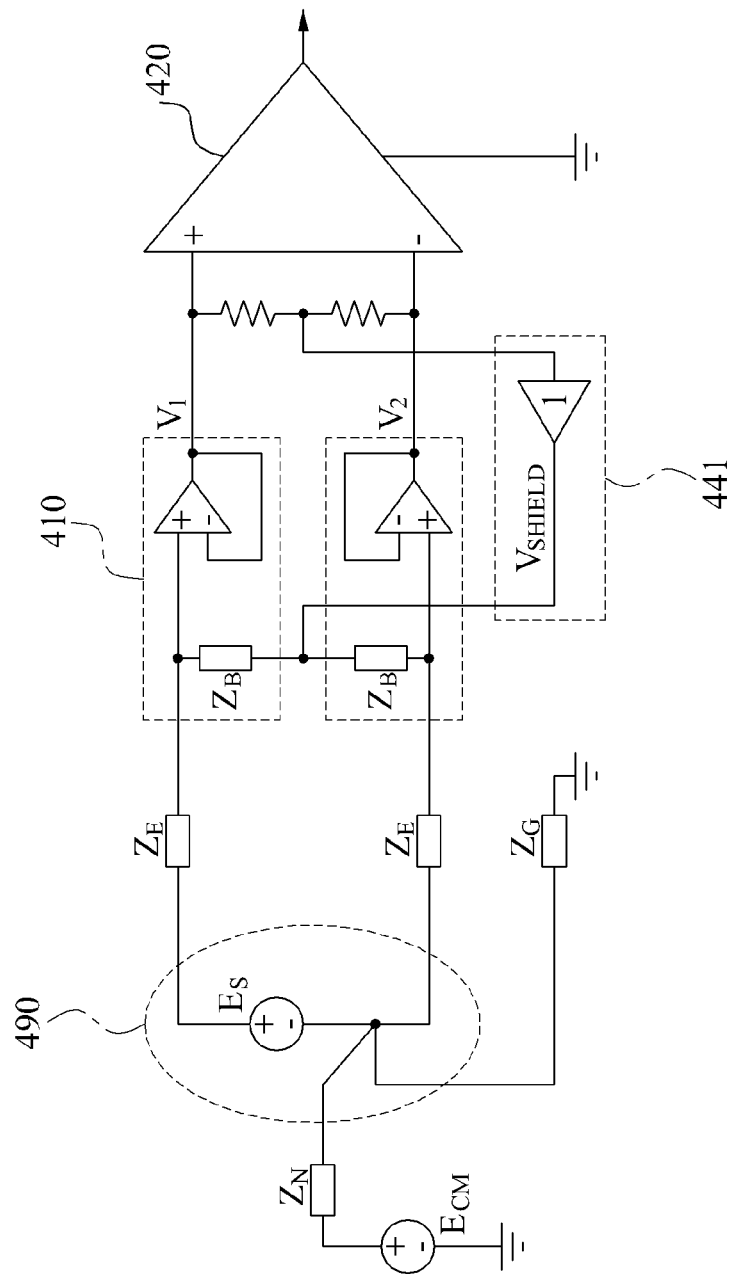
FIG. 4 is a circuit diagram illustrating an example of an IDC biosignal measurement device to which a unit gain common mode driven shield is applied.

FIG. 4 illustrates an example of an IDC biosignal measurement device to which a unit gain common mode driven shield is applied. Referring to FIG. 4, a human body 490 may be modeled as a signal source $E_S$, common mode noise between the human body 490 and the air may be modeled as impedance $Z_N$ and a signal source $E_{CM}$, and a relationship between the human body 490 and a ground may be modeled as impedance $Z_G$.

In FIG. 4, a common mode noise component based on a ground shield, for example, a shield voltage $V_{SHIELD}$=0, may be expressed as follows. In a case in which impedance of two electrodes is identical to impedance of clothes with respect to the two electrodes, a differential component observed at an input end of a differential amplifier 420 may be expressed as the following Equation 1. In this example, the common mode noise component is absent in Equation 1. The impedance of clothes may differ as follows.

For example, in a case in which the impedance of clothes with respect to one of two electrodes varies from $Z_E$ to $Z_E + \Delta Z_E$, the differential component of the input end of the differential amplifier 420 may be approximated to the following Equation 2. In this example, $Z_{E>>}\Delta Z_E$ is applied. Equation 2 may express a differential component by a common mode voltage source $E_{CM}$, and a magnitude of the aforementioned differential component may be in proportion to a difference $\Delta Z_E$ in clothes impedance between two electrodes. The common mode voltage source $E_{CM}$ may refer to a signal source $$V_1 - V_2 = E_S \frac{Z_B}{Z_B + Z_E} \quad \text{[Equation 1]}$$

$$V_1 - V_2 \approx E_{CM} \frac{\Delta Z_E Z_B Z_G}{(Z_B + Z_E)^2 Z_N} + E_S \frac{Z_B}{Z_B + Z_E} \quad \text{[Equation 2]}$$

Each of $V_1$ and $V_2$ denotes an output obtained when a biosignal interacting with the shield voltage passes through a pre-amplifier and has a unit of "V". The average of $V_1$ and $V_2$ may be used as a common mode signal and a difference between $V_1$ and $V_2$ may be used as a differential component. $E_S$ denotes a signal source obtained by modeling a biosignal of the human body 490, and has a unit of "V". $Z_B$ denotes shield impedance formed between an electrode and a shield and has a unit of ohm, and $Z_E$ denotes the impedance of clothes and has a unit of ohm. $Z_G$ denotes impedance between the human body 490 and the ground and has a unit of ohm, and $Z_N$ denotes modeled impedance between the human body 490 and the air and has a unit of ohm. $E_{CM}$ denotes a signal source obtained by modeling the common mode noise between the human body 490 and the air and has a unit of "V".

In various aspects, FIG. 4 illustrates an example of an IDC biosignal measurement device to which a unit-gain common mode driven shield is applied. In this example, as given by Equation 3 below, the shield voltage $V_{SHIELD}$ may interact as the average voltage between two outputs of two electrodes. The average voltage between two outputs may be expressed as a common mode voltage signal that is approximately applied in common to two electrodes.

$$V_{SHIELD} = (V_1 + V_2)/2 \quad \text{[Equation 3]}$$

For example, referring to FIG. 4, the common mode voltage may have a gain of "1" and may be connected to the shield through a common mode interacting unit 441. Accordingly, input impedance of an electrode may be increased equivalently with respect to a common mode component. Thus, common mode noise may be decreased by the asymmetry of the impedance $Z_E$ of clothes.

According to various aspects, the unit gain common mode driven shield may decrease common mode noise by equivalently increasing the input impedance of the electrode. Compared to a case of measuring a biosignal using an existing different electrode, in the case of measuring a biosignal using a CCE 410, a relatively small effect may be achieved since the shield impedance $Z_B$ of FIG. 3 is relatively great. Specifically, the input impedance $Z_A$ of the operation amplifier may be relatively decreased compared to the shield impedance $Z_B$. For example, in the case of applying the unit-gain common mode driven shield to measure a biosignal using the CCE 410, the shield impedance $Z_B$ equivalently increases, but the input impedance $Z_A$ connected in parallel thereto is maintained without being increased. Accordingly, an increase in the equivalent input impedance with respect to the entire electrode common mode component may decrease.

Figure 5:
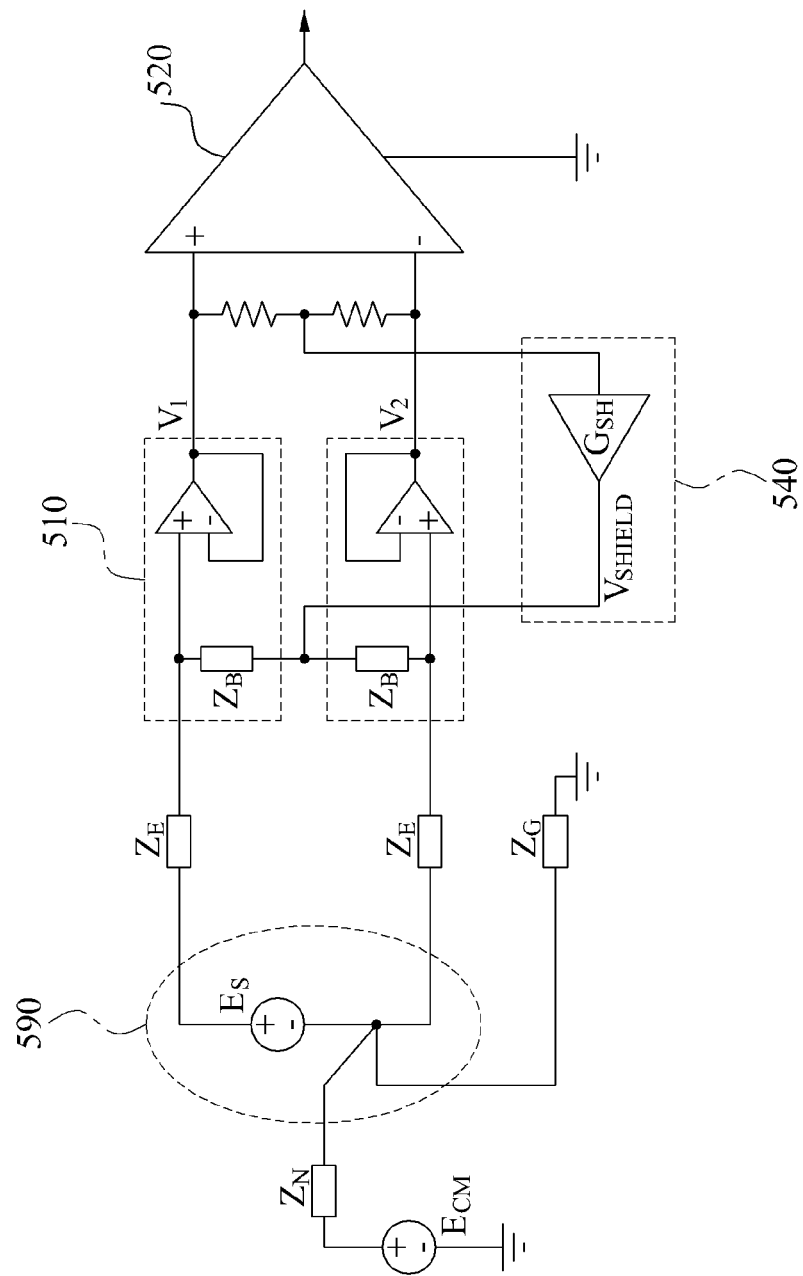
FIG. 5 is a circuit diagram illustrating an example of a device to measure a biosignal using a common mode driven shield.

FIG. 5 illustrates an example of a device for measuring a biosignal using a common mode driven shield. Referring to FIG. 5, a human body 590, a CCE 510, and a differential amplifier 520 may be similar to the human body 490, the CCE 410, and the differential amplifier 420 of FIG. 4.

A common mode driven shield of an input impedance compensation type according to various examples may determine a common mode driven gain to maximize input impedance of an electrode with respect to a common mode component using a common mode interacting unit 540. A shield voltage $V_{SHIELD}$ may interact with a common mode signal using the common mode interacting unit 540 according to Equation 4 below.

$$V_{SHIELD} = G_{SH}(V_1 - V_2)/2 \quad \text{[Equation 4]}$$

In Equation 4, an optimal common mode driven gain $G_{SH}$ may be expressed as in Equation 5 below.

$$G_{SH} = \frac{Z_A + Z_B}{Z_A} = \frac{R_A + R_B + (C_A + C_B)R_A R_B s}{R_A + C_B R_A R_B s} \quad \text{[Equation 5]}$$

The CCE 510 may include an electrode face, the common mode interacting unit 540, a shield, and a pre-amplifier.

The electrode face may sense a biosignal through the impedance of clothes as modeled by $Z_E$.

The common mode interacting unit 540 enables the common mode signal to interact with the shield voltage in order to compensate for a predetermined frequency band. Here, the predetermined frequency band may include a frequency band determined to decrease common mode noise. For example, the predetermined frequency band may include a frequency band in which noise desired to be removed by a user occurs or a frequency band in which power noise occurs, such as a frequency band of 60 Hz.

The common mode interacting unit 540 may include a filter configured to enable a signal of the predetermined frequency band in the common mode signal to pass. For example, the filter may include a capacitor, a resistance, and a passive element that are configured to enable the signal of the predetermined frequency band to pass at a predetermined gain. Here, the predetermined gain may include a common mode driven gain. For example, the common mode driven gain may be predetermined at a ratio of input impedance to a sum of input impedance and shield impedance, for example, $$\frac{Z_A + Z_B}{Z_A}$$

according to Equation 5.

The common mode interacting unit 540 may include a frequency band changing unit configured to change a frequency band of the common mode signal for compensating for the biosignal according to a control of a user. Also, the common mode interacting unit 540 may include an adjusting unit configured to adjust a gain and a phase of the common mode signal to correspond to a predetermined common mode driven gain. For example, when the common mode interacting unit 540 is configured as a resistor-capacitor (RC) network, the adjusting unit may include a variable resistance and a variable capacitor configured to adjust a pass band frequency and a pass band gain.

The shield may be made using a conductive material and may block other noise occurring outside the CCE 510. The shield may feed back the shield voltage interacting with the common mode signal as a biosignal sensed on the electrode face.

The pre-amplifier may amplify the biosignal interacting with the common mode signal. For example, the pre-amplifier may be configured as a buffer to transfer two biosignals to the differential amplifier 520. The transferred biosignals may be used to output the common mode signal and a differential signal.

An IDC biosignal measurement device, for example, a device to measure a biosignal using a common mode driven shield according to an example may include the common mode interacting unit 540, the CCE 510, and the differential amplifier 520. An operation of the common mode interacting unit 540 and the CCE 510 is described above and thus, a further description related thereto will be omitted.

The differential amplifier 520 may extract a differential signal by amplifying a differential component between two biosignals transferred from the pre-amplifier. For example, the differential signal may include an ECG signal.

Figure 6:
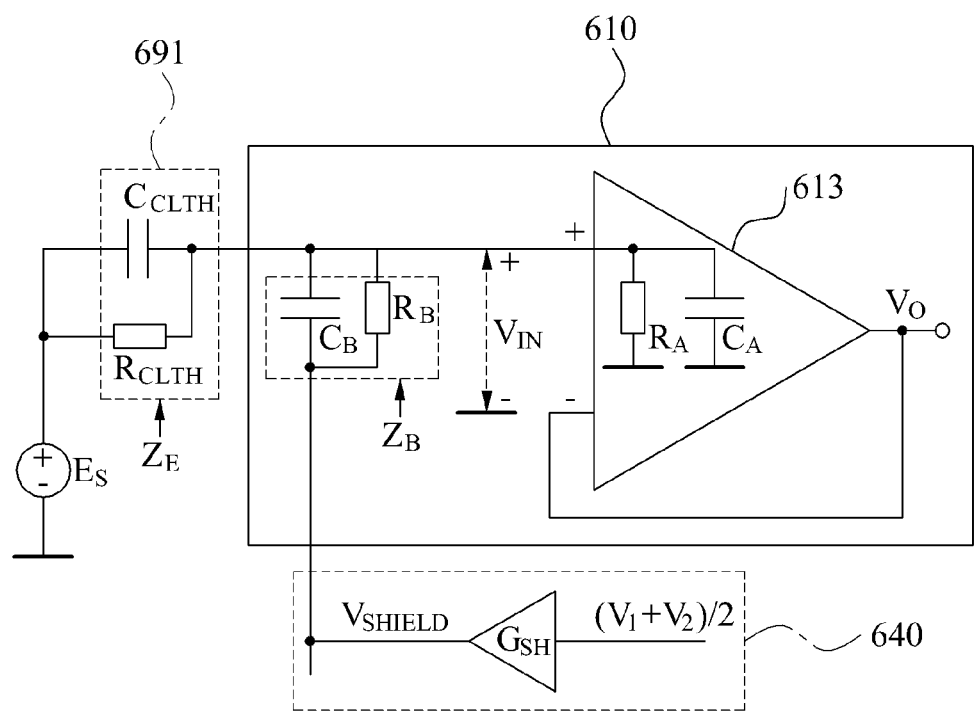
FIG. 6 is a circuit diagram illustrating an example of a CCE.

FIG. 6 is a diagram illustrating an example of a CCE 610. Clothes 691, the CCE 610, and a pre-amplifier 613 may be similar to the clothes 391, the CCE 310, and the pre-amplifier 313 of FIG. 3. A shield voltage of the CCE 610 may interact with a common mode signal through a common mode interacting unit 640.

According to an example, a voltage, such as a shield voltage of a shield configured to surround a capacitive electrode, may interact with the common mode signal. Thus, it is possible to decrease common mode noise. The CCE 610 may be used alone, or may be used simultaneously by applying a right-leg-driven (RLD) ground.

The CCE 610 may have a small ground size and thus, may be applied to an IDC biosignal measurement device having a poor ground, and may be simultaneously applied together with the RLD ground to thereby further decrease common mode noise of the biosignal measurement device.

The CCE 610 having a relatively reduced ground size compared to an existing ground may be applied to a device having a limited size on an electrode and a ground, such as a wearable IDC biosignal measurement device. Due to enhanced convenience in measurement, a biosignal may be measured without awareness of a measurement target. Further, the CCE 610 may be applied to various heartbeat based applications. For example, the variety of heartbeat based applications may include an R-peak based ECG measurement device, a sleep prevention device, a daily sleep and stress monitoring device, and a companion animal monitoring device.

A circuit in which a common mode driven shield is configured using a sum of outputs of a high band pass (HBP) filter and a low band pass (LBP) filter, a circuit in which a common mode driven shield is configured using a HBP filter, and a common mode driven circuit in which a gain is determined to maximize a rate of decrease in a predetermined frequency band will be described with reference to FIG. 7 through FIG. 9.

Figure 7A:
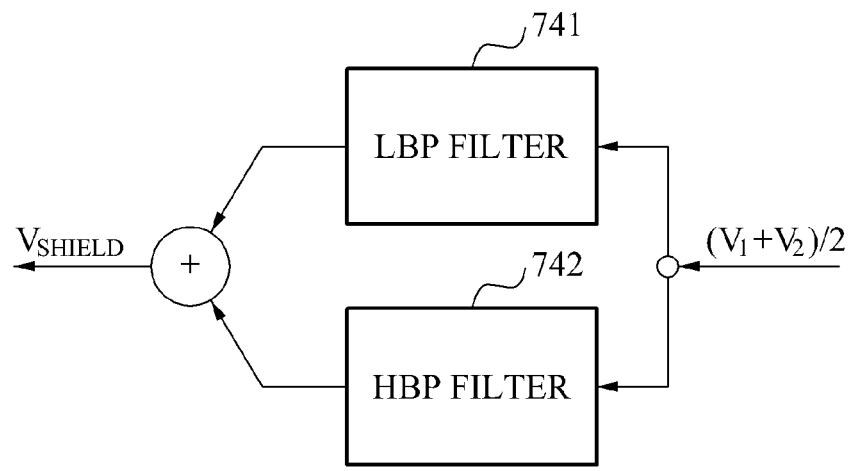
FIGS. 7A and 7B are circuit diagrams illustrating an example of a common mode interacting unit including a combination of a low band pass (LBP) filter and a high band pass (HBP) filter.
Figure 7B:
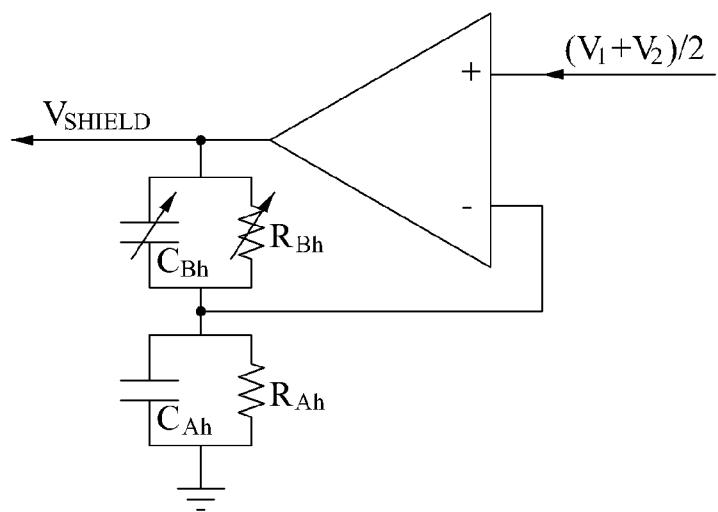

FIGS. 7A and 7B are diagrams illustrating an example of a common mode interacting unit including a combination of an LBP filter 741 and an HBP filter 742. It is noted that the common mode interacting unit may be referred to as a common mode interworking unit or a common mode interacting unit which enables the shield voltage to interwork or interact with the common mode signal.

FIG. 7A is a diagram illustrating an example of a combination of the LBP filter 741 and the HBP filter 742. A cutoff frequency of two filters, for example, the LBP filter 741 and the HBP filter 742 may be determined as $2\pi C_B R_B$, a pass band gain of the LBP filter 741 may be determined as $(R_A+R_B)/R_A$, and a pass band gain of the HBP filter 742 may be determined as $(C_A+C_B)/C_B$. A common mode driven gain optimized based on the combination of the LBP filter 741 and the HBP filter 742 may be expressed as in Equation 6 below. Here, in addition to a first filter, an $n^{th}$ filter may also be used for each of the LBP filter 741 and the HBP filter 742. For example, n may denote a natural number greater than or equal to "1".

$$G_{SH} = \frac{R_A + R_B}{R_A} \frac{1}{1 + C_B R_B s} + \frac{C_A + C_B}{C_B} \frac{C_B R_B s}{1 + C_B R_B s} \qquad \text{[Equation 6]}$$

FIG. 7B is a diagram illustrating an RC network circuit of the combination of the LBP filter 741 and the HBP filter 742 of FIG. 7A. By configuring resistances ($R_{Ah}$ and $R_{Bh}$) and capacitors ($C_{Ah}$ and $C_{Bh}$) as illustrated in FIG. 7B and by determining a magnitude of each passive element according to Equation 7 below, the common mode signal to which the predetermined common mode driven gain is applied may interwork with the shield voltage.

$$\frac{R_A}{R_{Ah}} = \frac{C_{Ah}}{C_A} = \frac{R_B}{R_{Bh}} = \frac{C_{Bh}}{C_B} \qquad \text{[Equation 7]}$$

According to an example, it is possible to adjust a gain and a phase of the common mode signal to correspond to a predetermined common mode driven gain using an adjusting unit. For example, the adjusting unit may include $R_{Bh}$ and $C_{Bh}$ to which a variable element is applied, and may change the gain and the phase of the common mode signal by adjusting magnitudes of $R_{Bh}$ and $C_{Bh}$.

Figure 8:
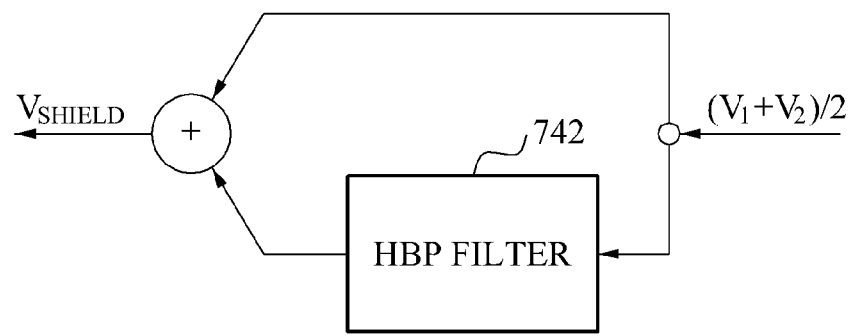
FIG. 8 is a diagram illustrating an example of a common mode interacting unit including an HBP filter.

FIG. 8 is a diagram illustrating an example of a common mode interacting unit including the HBP filter 742. Referring to FIG. 8, a common mode driven gain may be configured in a simpler form using a single HBP filter 742. In this example, a rate of decrease of common mode noise in a relatively high frequency may be relatively small compared to an optimal gain of the common mode interacting unit including a combination of the LBP filter 741 and the HBP filter 742. In the case of using the single HBP filter 742, the common mode driven gain may be expressed according to Equation 8 below. In Equation 8, s denotes a frequency component.

$$G_{SH} = 1 + \frac{C_A}{C_B} \frac{C_B R_B s}{1 + C_B R_B s} \qquad [\text{Equation 8}]$$

Figure 9:
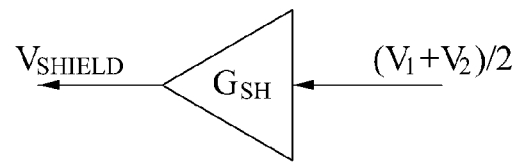
FIG. 9 is a diagram illustrating an example of a common mode interacting unit tuned for a predetermined frequency.

FIG. 9 is a diagram illustrating an example of a common mode interacting unit tuned for a predetermined frequency. Referring to FIG. 9, the common mode interacting unit may configure a common mode driven gain using a simple amplifier. As described above, in the case of using the simple amplifier, the common mode noise may not be uniformly decreased within the overall frequency range and a decrease rate thereof may increase in a predetermined frequency portion. For example, a gain may be tuned and used to be suitable for a power noise frequency as given by Equation 9 below. In Equation 9, $\omega_0$ denotes a frequency component and may be tuned for the power noise frequency.

$$G_{SH} = 1 + \frac{C_A R_B \omega_0}{\sqrt{1 + (C_B R_B \omega_0)^2}} \qquad [\text{Equation 9}]$$

Figure 10A:
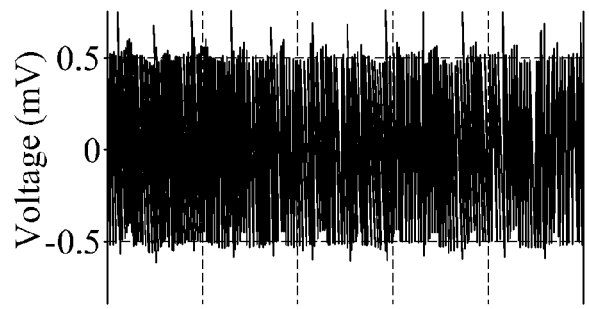
FIGS. 10A, 10B, and 10C are graphs illustrating an example of a magnitude of power noise of a common mode driven shield and a ground shield.
Figure 10B:
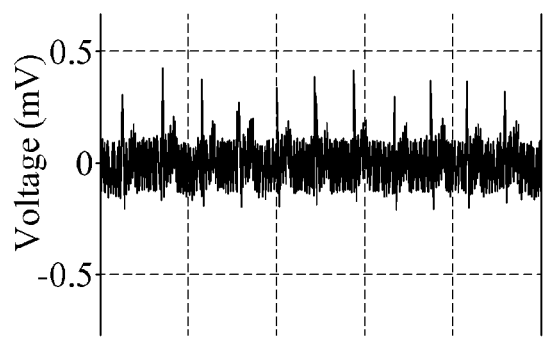
Figure 10C:

FIGS. 10A through 10C are diagrams illustrating an example of a magnitude of power noise of a common mode driven shield and a ground shield. Here, a power noise reduction effect of a device to measure a biosignal using a common mode driven shield may be known.

FIG. 10A is a diagram illustrating a result of measuring a biosignal using the ground shield, FIG. 10B is a diagram illustrating a result of measuring a biosignal using the unit-gain common mode driven shield, and FIG. 10C is a diagram illustrating a result of measuring a biosignal using the common mode driven shield to which an optimal common mode driven gain is applied. Referring to FIG. 10B, in the case of measuring a biosignal using the common mode driven shield, the power noise may be significantly decreased. Referring to FIG. 10C, in the case of measuring a biosignal using the optimal common mode driven shield, the power noise may be mostly removed. The power noise may include noise of 60 Hz.

Figure 11:
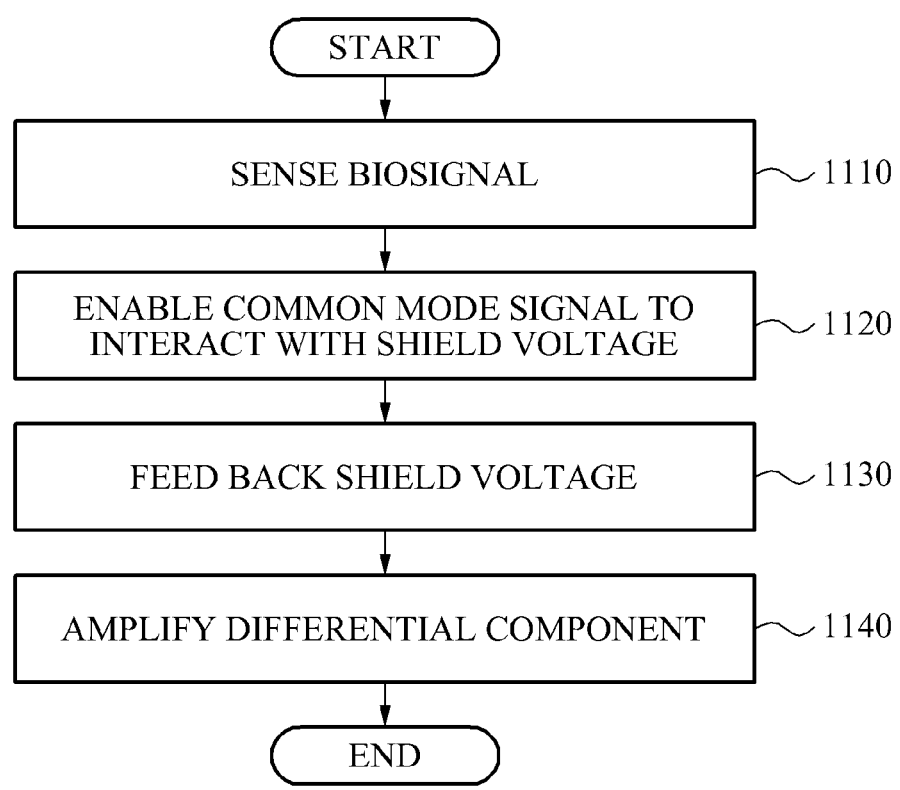
FIG. 11 is a flowchart illustrating an example of a method to measure a biosignal using a common mode driven shield.

FIG. 11 is a diagram illustrating an example of a method to measure a biosignal using a common mode driven shield.

Referring to FIG. 11, in 1110, a biosignal of a target is sensed. For example, the biosignal may include an ECG, an electrooculogram (EOG), an electromyogram (EMG), and an electroencephalogram (EEG).

In 1120, a common mode signal interacts with a shield voltage in order to compensate for a predetermined frequency band using a common mode interacting unit. The common mode interacting unit may include a filter configured to enable a signal of the predetermined frequency band in the common mode signal to pass, a frequency band changing unit configured to change a frequency band of the common mode signal for compensating for the biosignal according to a control of a user, a driven gain applying unit configured to enable the common mode signal to interwork with the shield voltage by applying a common mode driven gain to the common mode signal at a ratio of input impedance to a sum of input impedance and shield impedance, and an adjusting unit configured to adjust a gain and a phase of the common mode signal to correspond to a predetermined common mode driven gain.

The filter may include at least one of a LBP filter and a HBP filter through which the common mode signal passes. For example, each of the LBP filter and the HBP filter may include a capacitor, a resistance, and a passive element that are configured to enable a frequency band signal to pass at a predetermined gain.

In 1130, a shield voltage is fed back to the sensed biosignal. For example, the common mode interacting unit may receive the common mode signal and may output the shield voltage to the same node as an electrode face on which the biosignal is sensed.

In 1140, a differential component of the biosignal to which the shield voltage is fed back is amplified. For example, as described above with reference to FIG. 5, the differential component may be amplified using the differential amplifier. Also, the differential component may be extracted using the differential amplifier and the extracted differential component may be amplified using a separate amplifier.

The various units, modules, elements, and methods described above may be implemented using one or more hardware components, one or more software components, or a combination of one or more hardware components and one or more software components.

A hardware component may be, for example, a physical device that physically performs one or more operations, but is not limited thereto. Examples of hardware components include microphones, amplifiers, low-pass filters, high-pass filters, band-pass filters, analog-to-digital converters, digital-to-analog converters, and processing devices.

A software component may be implemented, for example, by a processing device controlled by software or instructions to perform one or more operations, but is not limited to thereto. A computer, controller, or other control device may cause the processing device to run the software or execute the instructions. One software component may be implemented by one processing device, or two or more software components may be implemented by one processing device, or one software component may be implemented by two or more processing devices, or two or more software components may be implemented by two or more processing devices.

A processing device may be implemented using one or more general-purpose or special-purpose computers, such as, for example, a processor, a controller and an arithmetic logic unit, a digital signal processor, a microcomputer, a field-programmable array, a programmable logic unit, a microprocessor, or any other device capable of running software or executing instructions. The processing device may run an operating system (OS), and may run one or more software applications that operate under the OS. The processing device may access, store, manipulate, process, and create data when running the software or executing the instructions. For simplicity, the singular term "processing device" may be used in the description, but one of ordinary skill in the art will appreciate that a processing device may include multiple processing elements and multiple types of processing elements. For example, a processing device may include one or more processors, or one or more processors and one or more controllers. In addition, different processing configurations are possible, such as parallel processors or multi-core processors.

A processing device configured to implement a software component to perform an operation A may include a processor programmed to run software or execute instructions to control the processor to perform operation A. In addition, a processing device configured to implement a software component to perform an operation A, an operation B, and an operation C may have various configurations, such as, for example, a processor configured to implement a software component to perform operations A, B, and C; a first processor configured to implement a software component to perform operation A, and a second processor configured to implement a software component to perform operations B and C; a first processor configured to implement a software component to perform operations A and B, and a second processor configured to implement a software component to perform operation C; a first processor configured to implement a software component to perform operation A, a second processor configured to implement a software component to perform operation B, and a third processor configured to implement a software component to perform operation C; a first processor configured to implement a software component to perform operations A, B, and C, and a second processor configured to implement a software component to perform operations A, B, and C, or any other configuration of one or more processors each implementing one or more of operations A, B, and C. Although these examples refer to three operations A, B, C, the number of operations that may implemented is not limited to three, but may be any number of operations required to achieve a desired result or perform a desired task.

Software or instructions for controlling a processing device to implement a software component may include a computer program, a piece of code, an instruction, or some combination thereof, for independently or collectively instructing or configuring the processing device to perform one or more desired operations. The software or instructions may include machine code that may be directly executed by the processing device, such as machine code produced by a compiler, and/or higher-level code that may be executed by the processing device using an interpreter. The software or instructions and any associated data, data files, and data structures may be embodied permanently or temporarily in any type of machine, component, physical or virtual equipment, computer storage medium or device, or a propagated signal wave capable of providing instructions or data to or being interpreted by the processing device. The software or instructions and any associated data, data files, and data structures also may be distributed over network-coupled computer systems so that the software or instructions and any associated data, data files, and data structures are stored and executed in a distributed fashion.

For example, the software or instructions and any associated data, data files, and data structures may be recorded, stored, or fixed in one or more non-transitory computer-readable storage media. A non-transitory computer-readable storage medium may be any data storage device that is capable of storing the software or instructions and any associated data, data files, and data structures so that they can be read by a computer system or processing device. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, or any other non-transitory computer-readable storage medium known to one of ordinary skill in the art.

Functional programs, codes, and code segments for implementing the examples disclosed herein can be easily constructed by a programmer skilled in the art to which the examples pertain based on the drawings and their corresponding descriptions as provided herein.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A capacitive coupling active electrode (CCE) circuit, comprising:
    an electrode face configured to sense a biosignal without contact to a human body;
    a common mode interacting unit configured to enable a common mode signal to interact with a shield voltage, in order to compensate for a frequency band, by feeding back the common mode signal to a shield and by applying a common mode driven gain to the common mode signal based on a ratio of input impedance to a sum of the input impedance and shield impedance; and
    the shield configured to provide the shield voltage.

2. The CCE circuit of claim 1, further comprising:
    a preamplifier configured to amplify the shield voltage and the biosignal,
    wherein the shield is further configured to provide the shield voltage to the pre-amplifier.

3. The CCE circuit of claim 1, wherein the common mode interacting unit comprises a filter configured to enable a signal of the frequency band in the common mode signal to pass.

4. The CCE circuit of claim 3, wherein the filter comprises a capacitor, a resistance, and a passive element that are configured to enable the signal of the frequency band to pass at a gain.

5. The CCE circuit of claim 1, wherein the common mode interacting unit comprises a frequency band changing unit configured to change a frequency band of the common mode signal for compensating for the biosignal according to a control of a user.

6. The CCE circuit of claim 1, wherein the common mode interacting unit comprises a driven gain applying unit configured to enable the common mode signal to interact with the shield voltage by applying the common mode driven gain to the common mode signal at the ratio of the input impedance to the sum of the input impedance and the shield impedance.

7. The CCE circuit of claim 1, wherein the common mode interacting unit comprises at least one of a low band pass (LBP) filter and a high band pass (HBP) filter through which the common mode signal passes.

8. The CCE circuit of claim 1, wherein the common mode interacting unit comprises an adjusting unit configured to adjust a gain and a phase of the common mode signal to correspond to a common mode driven gain.

9. A capacitive coupling active electrode (CCE) circuit, comprising:
   an electrode face configured to sense a biosignal without contact to a human body;
   a common mode interacting unit configured to enable a common mode signal to interact with a shield voltage, in order to compensate for a frequency band, by feeding back the common mode signal to a shield; and
   the shield configured to provide the shield voltage, wherein the common mode interacting unit comprises an adjusting unit configured to adjust a gain and a phase of the common mode signal to correspond to a common mode driven gain.

10. A device for measuring a biosignal, the device comprising:
    a common mode interacting unit configured to feed back a common mode signal to a shield for compensating for a frequency band, and apply a common mode driven gain to the common mode signal based on a ratio of input impedance to a sum of the input impedance and shield impedance;
    a capacitive coupling active electrode (CCE) comprising an electrode face configured to measure the biosignal without contact to a human body and the shield connected to the common mode interacting unit; and
    a differential amplifier configured to amplify a differential component of the biosignal measured by the CCE.

11. The device of claim 10, further comprising:
    a pre-amplifier disposed at a rear of the electrode face, wherein the shield surrounds the electrode face and the pre-amplifier.

12. The device of claim 10, wherein the common mode interacting unit comprises a filter configured to enable a signal of the frequency band in the common mode signal to pass.

13. The device of claim 12, wherein the filter comprises a capacitor, a resistance, and a passive element that are configured to enable the signal of the frequency band to pass at a gain.

14. The device of claim 12, wherein the common mode interacting unit comprises at least one of a low band pass (LBP) filter and a high band pass (HBP) filter through which the common mode signal passes.

15. The device of claim 10, wherein the common mode interacting unit comprises a driven gain applying unit configured to enable the common mode signal to interact with the shield voltage by applying the common mode driven gain to the common mode signal at a ratio of the input impedance to a sum of the input impedance and the shield impedance.

16. The device of claim 10, wherein the common mode interacting unit comprises a frequency band changing unit configured to change a frequency band of the common mode signal for compensating for the biosignal according to a control of a user.

17. The device of claim 10, wherein the common mode interacting unit comprises an adjusting unit configured to adjust a gain and a phase of the common mode signal to correspond to a common mode driven gain.

18. A device for measuring a biosignal, the device comprising:
    a common mode interacting unit configured to feed back a common mode signal to a shield for compensating for a frequency band;
    a capacitive coupling active electrode (CCE) comprising an electrode face configured to measure the biosignal without contact to a human body and the shield connected to the common mode interacting unit; and
    a differential amplifier configured to amplify a differential component of the biosignal measured by the CCE, wherein the common mode interacting unit comprises a frequency band changing unit configured to change a frequency band of the common mode signal for compensating for the biosignal according to a control of a user.

19. A device for measuring a biosignal, the device comprising:
    a common mode interacting unit configured to feed back a common mode signal to a shield for compensating for a frequency band;
    a capacitive coupling active electrode (CCE) comprising an electrode face configured to measure the biosignal without contact to a human body and the shield connected to the common mode interacting unit; and
    a differential amplifier configured to amplify a differential component of the biosignal measured by the CCE, wherein the common mode interacting unit comprises an adjusting unit configured to adjust a gain and a phase of the common mode signal to correspond to a common mode driven gain.

20. A method for measuring a biosignal, the method comprising:
    sensing the biosignal without contact to a human body;
    enabling a common mode signal to interact with a shield voltage in order to compensate for a frequency band by applying a common mode driven gain to the common mode signal depending on a relationship with respect to input impedance and shield impedance;
    feeding back the shield voltage to the biosignal; and
    amplifying a differential component of the biosignal to which the shield voltage is fed back.

21. The method of claim 20, wherein the enabling comprises enabling a signal of the frequency band in the common mode signal to pass.

22. The method of claim 20, wherein the enabling comprises changing a frequency band of the common mode signal for compensating of the biosignal according to a control of a user.

23. The method of claim 20, wherein the enabling comprises enabling the common mode signal to interact with the shield voltage by applying a common mode driven gain to the common mode signal at a ratio of the input impedance to a sum of the input impedance and the shield impedance.

24. The method of claim 20, wherein the enabling comprises adjusting a gain and a phase of the common mode signal to correspond to a common mode driven gain.

25. A method for measuring a biosignal, the method comprising:
    sensing the biosignal without contact to a human body;
    enabling a common mode signal to interact with a shield voltage in order to compensate for a frequency band;
    feeding back the shield voltage to the biosignal; and amplifying a differential component of the biosignal to which the shield voltage is fed back, wherein the enabling comprises adjusting a gain and a phase of the common mode signal to correspond to a common mode driven gain.

26. An electrode circuit for sensing a biosignal, the electrode circuit comprising:
an interacting unit configured to enable a common mode signal to interact with a shield voltage, in order to compensate for a frequency band, by feeding back the common mode signal to a shield, the shield being configured to provide the shield voltage and by applying a common mode driven gain to the common mode signal based on a ratio of input impedance to a sum of the input impedance and shield impedance; and
a filter configured to enable a signal of the frequency band in the common mode signal to pass, wherein the electrode circuit is configured to sense the biosignal without contact to a human body.

* * * * *